(12) United States Patent
Hosaka et al.

(10) Patent No.: US 9,011,635 B2
(45) Date of Patent: Apr. 21, 2015

(54) PLASMA PROCESSING APPARATUS

(75) Inventors: Yuki Hosaka, Kurokawa (JP); Naokazu Furuya, Kurokawa (JP); Mitsunori Ohata, Kurokawa (JP)

(73) Assignee: Tokyo Electron Limited (JP)

( * ) Notice: Subject to any disclaimer, the term of this patent is extended or adjusted under 35 U.S.C. 154(b) by 695 days.

(21) Appl. No.: 13/409,847

(22) Filed: Mar. 1, 2012

(65) Prior Publication Data

US 2012/0222817 A1 Sep. 6, 2012

Related U.S. Application Data

(60) Provisional application No. 61/466,250, filed on Mar. 22, 2011.

(30) Foreign Application Priority Data

Mar. 3, 2011 (JP) ................................. 2011-046770

(51) Int. Cl.
*H01L 21/304* (2006.01)
*C23F 1/00* (2006.01)
*H01J 37/32* (2006.01)

(52) U.S. Cl.
CPC ..... *H01J 37/32577* (2013.01); *H01J 37/32422* (2013.01); *H01J 37/32568* (2013.01); *H01J 37/32623* (2013.01)

(58) Field of Classification Search
CPC ..................... H01J 37/32577; H01J 37/32422; H01J 37/32568; H01J 37/32623
USPC ....................................................... 156/345.44
See application file for complete search history.

(56) References Cited

U.S. PATENT DOCUMENTS

2006/0037701 A1* 2/2006 Koshiishi et al. ........ 156/345.44
2010/0294433 A1* 11/2010 Jianhui .................... 156/345.48

FOREIGN PATENT DOCUMENTS

| JP | 2006270018 | 10/2006 |
|----|------------|---------|
| JP | 2006339529 | 12/2006 |
| JP | 2008-251744 | 10/2008 |
| JP | 2010238980 | 10/2010 |

* cited by examiner

*Primary Examiner* — Keath Chen
(74) *Attorney, Agent, or Firm* — Cantor Colburn LLP

(57) ABSTRACT

A plasma processing apparatus includes: a first ground member provided in processing chamber in such a way that at least a portion of the first ground member is exposed to a processing space, wherein the first ground member forms a ground potential; a second ground member provided in an exhaust space of the processing chamber to face the first ground member in such a way that at least a portion of the second ground member is exposed to the exhaust space, wherein the second ground member forms a ground potential; and a ground rod that moves up and down between the first and second ground members and contacts any one of the first or second ground member to adjust a ground state of the first or second ground member.

6 Claims, 3 Drawing Sheets

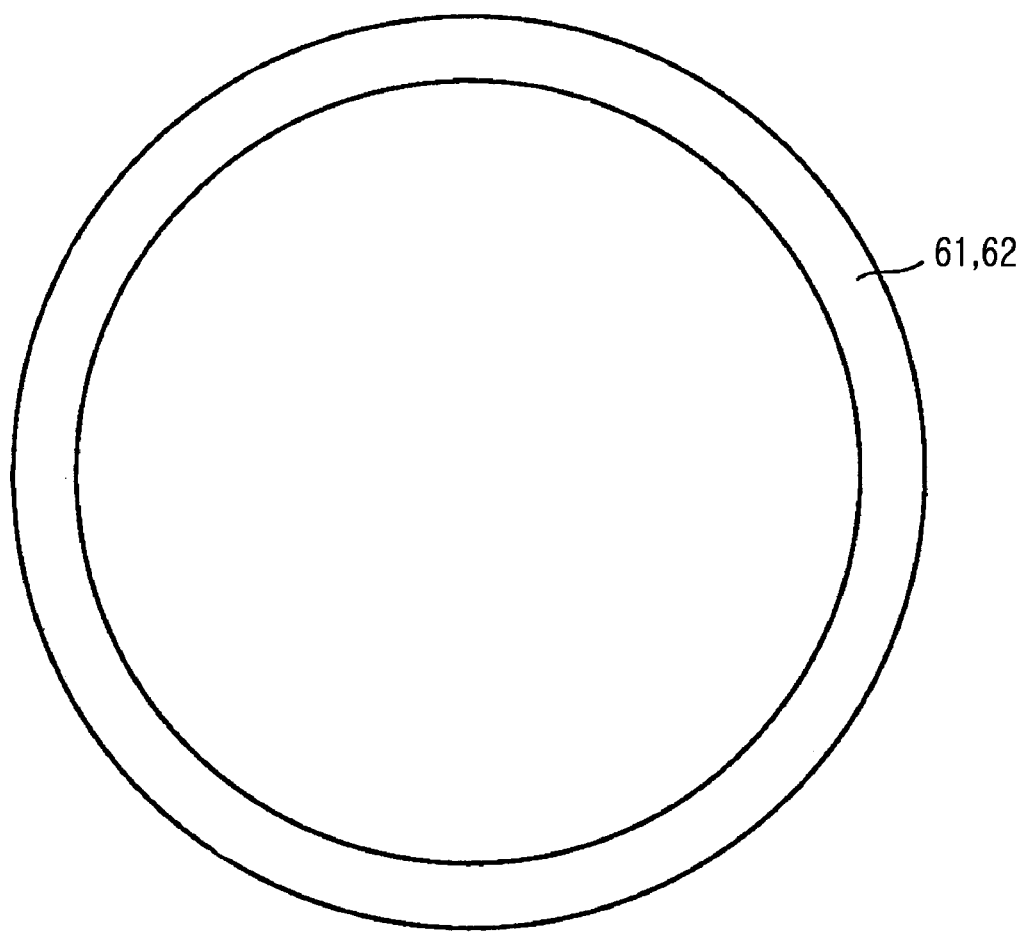

PLASMA PROCESSING APPARATUS

CROSS-REFERENCE TO RELATED PATENT APPLICATIONS

This application claims the benefits of Japanese Patent Application No. 2011-046770, filed on Mar. 3, 2011 in the Japan Patent Office, and U.S. Patent Application No. 61/466,250, filed on Mar. 22, 2011 in the U.S. Patent and Trademark Office, the disclosures of which are incorporated herein in its entirety by reference.

BACKGROUND OF THE INVENTION

1. Field of the Invention

The present invention relates to a plasma processing apparatus.

2. Description of the Related Art

Conventionally, in a process of manufacturing a semiconductor device, a plasma processing apparatus for performing various processes, for example, etching or film formation, is used by using plasma on a substrate (for example, a semiconductor wafer) held on a holding stage in a processing chamber. Also, as the plasma processing apparatus, there is known a capacity coupled plasma processing apparatus that includes an upper electrode provided in a ceiling portion of the processing chamber to face the holding stage on which the substrate is placed, and the holding stage as a lower electrode, which constitutes a pair of opposite electrodes.

In the capacity coupled plasma processing apparatus, as high-frequency power applied between the upper electrode and the lower electrode, first high-frequency power for generating plasma and having relatively high frequency and second high-frequency power for dragging ions and having a lower frequency than the frequency of the first high-frequency power are applied to the holding stage as the lower electrode.

Also, there is known a plasma processing apparatus that applies high-frequency power to a lower electrode and applies a direct current voltage to an upper electrode. As such, in the plasma processing apparatus applying a direct current voltage to the upper electrode, as a ground member for a direct current voltage, there is known a ring-shaped member formed of a conductive material, e.g., silicon, provided to be exposed in a processing chamber and to surround a holding stage (for example, refer to Patent Reference 1).

Recently, in a manufacturing field of a semiconductor device, since batch etching of a multi-layered structure has been mainstream, there is a need to perform a plurality of plasma etching processes or the like in a single processing chamber. Accordingly, there is a need to finely control plasma to meet conditions of an individual process.

3. Prior Art Reference (Patent Reference 1) Japanese Patent Laid-Open Publication No. 2008-251744

SUMMARY OF THE INVENTION

The present invention is made in view of this problem and provides a plasma processing apparatus capable of more finely controlling plasma compared to a conventional plasma processing apparatus.

According to an aspect of the present invention, a plasma processing apparatus includes: a processing chamber in which a processing space is provided; a lower electrode provided in the processing chamber and including a holding stage on which a substrate to be processed is placed; an upper electrode provided in the processing chamber to face the lower electrode; a high-frequency power source which applies high-frequency power to the lower electrode; a processing gas supply mechanism which supplies a processing gas for generating plasma to the processing space; a first ground member formed of a conductive material and having a ring shape, wherein the first ground member is provided in the processing chamber in such a way that at least a portion of the first ground member is exposed to the processing space, and the first ground member forms a ground potential; a second ground member which is provided to face the first ground member in an exhaust space provided in a lower part of the processing chamber and is formed of a conductive material and has a ring shape, wherein at least a portion of the second ground member is exposed to the exhaust space, and the second ground member forms a ground potential; and a ground rod that moves up and down between the first and second ground members and contacts any one of the first or second ground member to adjust a ground state of the first or second ground member.

BRIEF DESCRIPTION OF THE DRAWINGS

The above and other features and advantages of the present invention will become more apparent by describing in detail exemplary embodiments thereof with reference to the attached drawings in which:

FIG. 3 is a view schematically showing an upper ground ring and a lower ground ring of the plasma etching apparatus of FIG. 1.

DETAILED DESCRIPTION OF THE INVENTION

Figure 1:
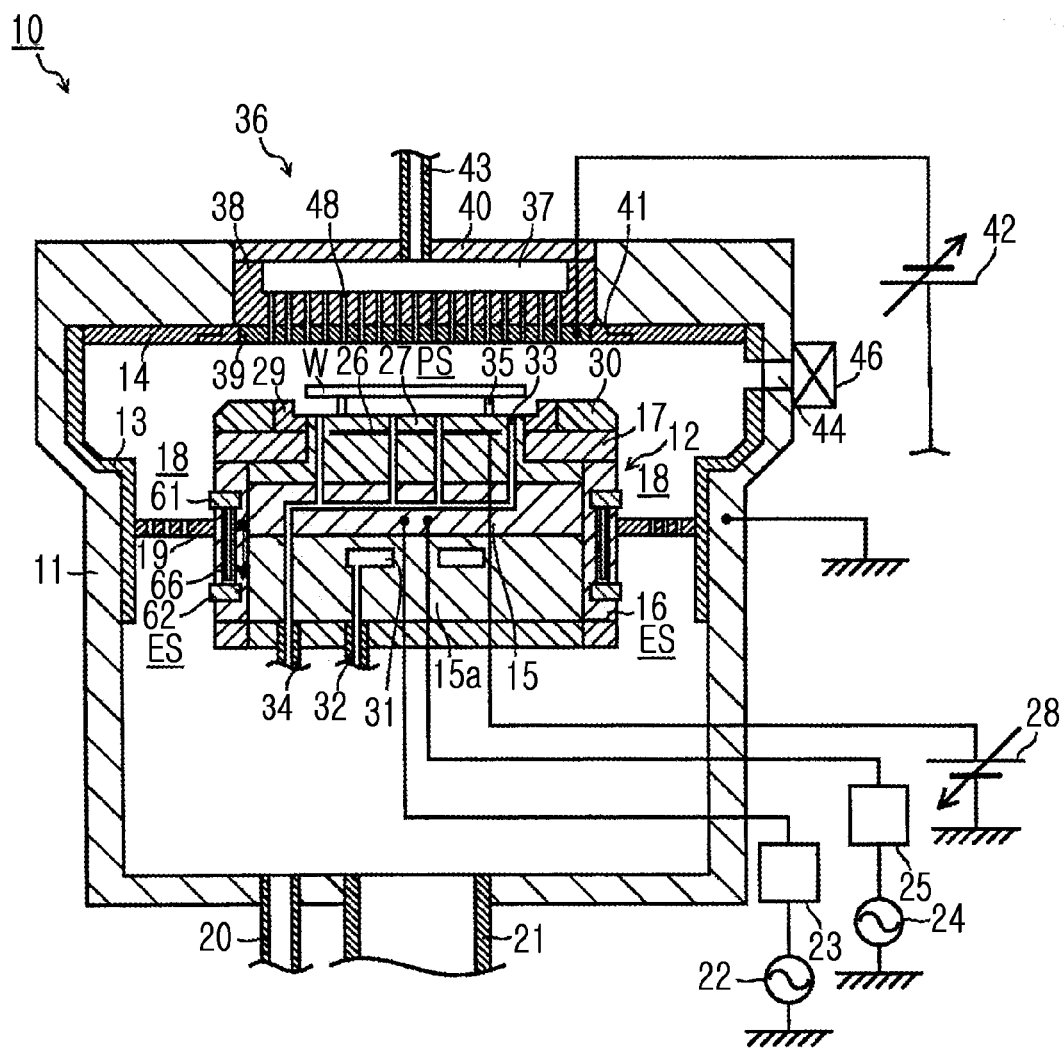
FIG. 1 is a view schematically showing a plasma etching apparatus according to an embodiment of the present invention.

Hereinafter, the present invention will be described in detail by explaining exemplary embodiments of the invention with reference to the attached drawings. FIG. 1 is a longitudinal cross-sectional view schematically showing a plasma etching apparatus 10 as a plasma processing apparatus according to an embodiment of the present invention.

The plasma etching apparatus 10 is airtightly configured and includes a processing chamber 11 in which a processing space PS is provided. The processing chamber 11 has a cylindrical shape and is formed of, for example, aluminum of which a surface is coated with an anodized film. A holding stage 12 having a circumferential shape is provided in the processing chamber 11 to horizontally support a semiconductor wafer W that is a substrate to be processed.

A lateral surface of an inner wall of the processing chamber 11 is covered by a lateral wall member 13, and an upper surface of the inner wall of the processing chamber 11 is covered by an upper wall member 14. The lateral wall member 13 and the upper wall member 14 are formed of, for example, aluminum, and surfaces thereof facing the processing space PS are coated with yttria or an anodized film having a predetermined thickness. The processing chamber 11 is electrically grounded, and thus potentials of the lateral wall member 13 and the upper wall member 14 are ground potentials.

Also, the holding stage 12 includes a conductor portion 15 formed of a conductive material, e.g., aluminum, a lateral surface coating member 16 covering a lateral surface of the conductor portion 15 and formed of an insulating material, an enclosure member 17 provided on the lateral surface coating member 16 and formed of quartz (Qz), and a holding stage base 15a formed of an insulating material and provided under the conductor portion 15.

An exhaust passage 18 is provided between the inner wall of the processing chamber 11 and a lateral surface of the holding stage 12 in the processing chamber 11. The exhaust passage 18 serves as a passage for evacuating a processing gas introduced into the processing space PS to an outside of the processing chamber 11. An exhaust plate 19 having a plurality of vent holes and a plate shape, is provided in the exhaust passage 18. The processing chamber 11 is divided into an exhaust space ES as a lower space of the processing chamber 11 and the exhaust passage 18 by the exhaust plate 19. A rough pumping exhaust pipe 20 and a main exhaust pipe 21 open into the exhaust space ES, a dry pump (not shown) is connected to the rough pumping exhaust pipe 20, and a turbo molecular pump (not shown) is connected to the main exhaust pipe 21. By using the dry pump and the turbo molecular pump, the processing space PS may be set to a depressurized atmosphere having predetermined pressure.

Meanwhile, an inlet/outlet 44 for the semiconductor wafer W is provided on a lateral wall of the processing chamber 11. A gate valve 46 for opening/closing the inlet/outlet 44 is provided in the inlet/outlet 44.

A first high-frequency power source 22 is connected to the conductor portion 15 of the holding stage 12 via a first matching unit 23. The first high-frequency power source 22 is used to generate plasma and applies relatively high frequency (equal to or more than 27 MHz, e.g., 40 MHz) power to the conductor portion 15. Also, the first matching unit 23 reduces reflection of high-frequency power from the conductor portion 15 to increase the efficiency of applying the high-frequency power to the conductor portion 15.

Also, a second high-frequency power source 24 is connected to the conductor portion 15 via a second matching unit 25. The second high-frequency power source 24 is used to drag ions (bias) and applies predetermined frequency (equal to or less than 13.56 MHz, for example, 3.2 MHz) power that is lower than the high-frequency power applied by the first high-frequency power source 22, to the conductor portion 15.

An electrostatic chuck 27 having a structure in which an electrode plate 26 is accommodated in a dielectric material is provided on an upper portion of the holding stage 12. A direct current power source 28 for an electrostatic chuck is electrically connected to the electrode plate 26 of the electrostatic chuck 27. A direct current voltage is applied to the electrode plate 26 from the direct current power source 28 for an electrostatic chuck so that the semiconductor wafer W is adsorbed and held on an upper surface of the electrostatic chuck 27 by Coulomb force or Johnson-Rahbek force.

Also, a focus ring 29 having an annular shape is provided on the upper portion of the holding stage 12 to surround the semiconductor wafer W adsorbed and held on the upper surface of the holding stage 12. The focus ring 29 is formed of silicon (Si), silica (SiO$_2$), silicon carbide (SiC), or the like. A cover ring 30 having an annular shape and formed of quartz is provided around the focus ring 29 to protect a lateral surface of the focus ring 29.

A coolant chamber 31 having an annular shape is provided in the holding stage 12 to extend, for example, in a circumferential direction. A coolant having a predetermined temperature, for example, cooling water or Galden (a registered trademark), is cyclically supplied from a chiller unit (not shown) to the coolant chamber 31 via a coolant pipe 32, and a processing temperature of the semiconductor wafer adsorbed and held on the upper surface of the holding stage 12 is controlled by the coolant.

A plurality of heat-transfer gas supply holes 33 are opened in an adsorbing surface of the upper surface of the holding stage 12 on which the semiconductor wafer W is adsorbed and held. The plurality of heat-transfer gas supply holes 33 are connected to a heat-transfer gas supply unit (not shown) via a heat-transfer gas supply line 34 provided in the holding stage 12. The heat-transfer gas supply unit supplies a heat-transfer gas, for example, helium (He) gas, to a gap between the adsorbing surface and a rear surface of the semiconductor wafer W via the heat-transfer gas supply holes 33.

In addition, a plurality of pusher pins 35 are provided in the holding stage 12 as lift pins that may be protruded freely from the upper surface of the holding stage 12. The pusher pins 35 are accommodated into the holding stage 12 when an etching process is performed by adsorbing and holding the semiconductor wafer W on the adsorbing surface. When the semiconductor wafer W is carried into/out of the holding stage 12, the pusher pins 35 are protruded from the holding surface to support the semiconductor wafer W on the holding stage 12.

A shower head 36 serving as an upper electrode is provided in a ceiling portion of the processing chamber 11 to face the holding stage 12. The shower head 36 and the holding stage 12 serve as a pair of electrodes, that is, the upper electrode and a lower electrode. The shower head 36 includes a cooling plate 38 in which a buffer chamber 37 is provided therein and that has a circular plate shape and is formed of an insulating material, an upper electrode plate 39 supported by a lower portion of the cooling plate 38, and a cover 40 covering an upper portion of the cooling plate 38.

A bottom surface of the upper electrode plate 39 is exposed to the processing space PS. The upper electrode plate 39 is formed of a conductive material, for example, silicon, and has a circular plate shape. A peripheral portion of the upper electrode plate 39 is covered by a shield ring 41 formed of an insulating material and having an annular shape. That is, the upper electrode plate 39 is electrically insulated from a wall portion of the processing chamber 11, which is at a ground potential, by the cooling plate 38 and the shield ring 41.

Also, the upper electrode plate 39 is electrically connected to an upper direct current power source 42. A direct current voltage is applied to the processing space PS by applying a negative direct current voltage from the upper direct current power source 42 to the upper electrode plate 39.

A processing gas-introducing pipe 43 is connected to the buffer chamber 37 of the cooling plate 38. The processing gas-introducing pipe 43 is connected to a gas supply unit (not shown). Also, a plurality of gas through-holes 48 are provided in the shower head 36 to allow the buffer chamber 37 to communicate with the processing space PS. The shower head 36 supplies a processing gas, which is supplied from the processing gas-introducing pipe 43 to the buffer chamber 37, to the processing space PS via the gas through-holes 48.

Figure 2:
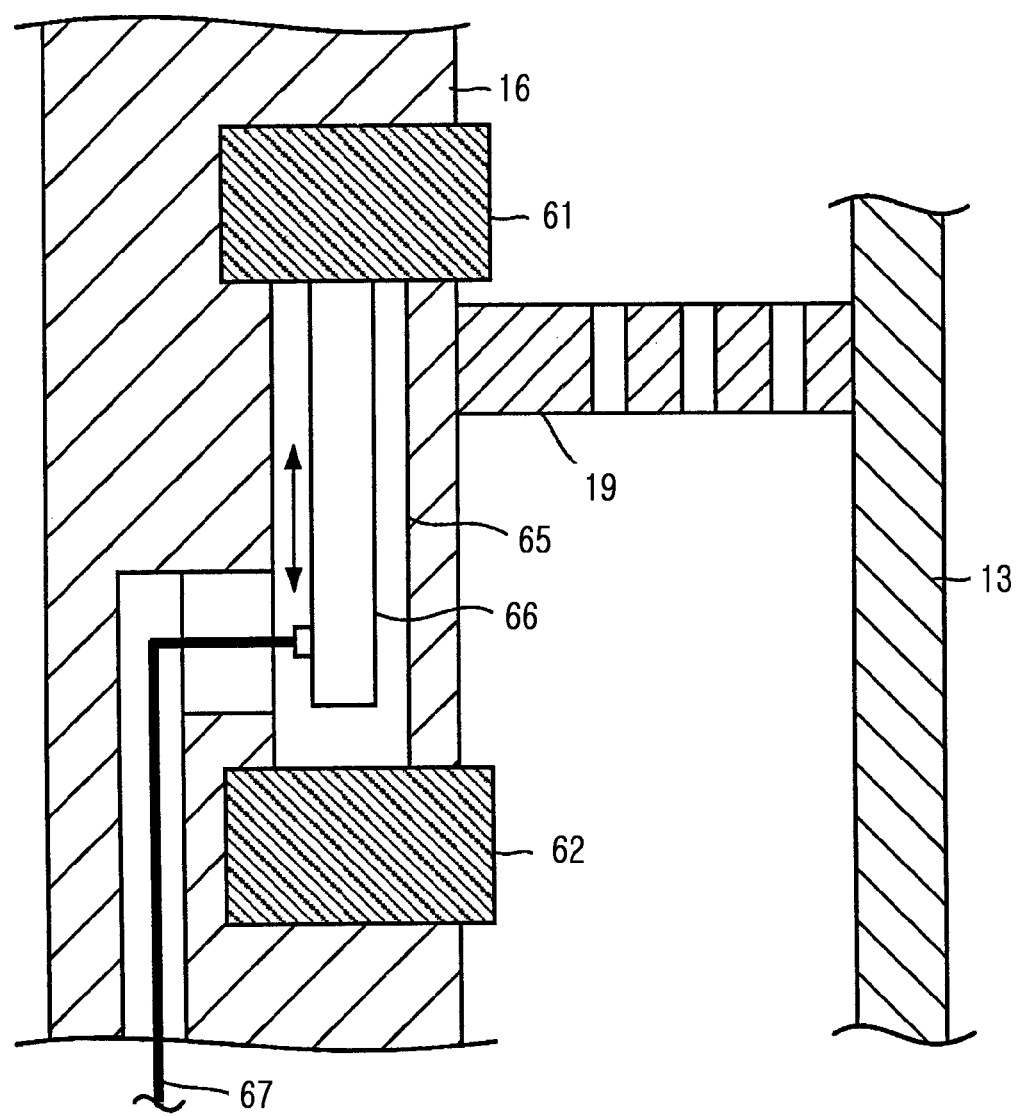
FIG. 2 is a view schematically showing main components of the plasma etching apparatus of FIG. 1.

As shown in FIG. 2, an upper ground ring 61 (a ground electrode) as a first ground member is provided over the exhaust plate 19 in the processing space PS. The upper ground ring 61 is formed of a conductive material, for example, silicon, silicon carbide, or a solid material such as aluminum and has an annular shape (see FIG. 3), and the upper ground ring 61 is provided in such a way that an outer portion thereof is exposed to the processing space PS and an inner portion thereof is buried in the lateral surface coating member 16.

A lower ground ring 62 (a ground electrode) as a second ground member is provided below the upper ground ring 61 and the exhaust plate 19 in the exhaust space ES to vertically face the upper ground ring 61. The lower ground ring 62, similar to the upper ground ring 61, is formed of a conductive material, for example, silicon, silicon carbide, or a solid material such as aluminum and has an annular shape (see FIG. 3), and the lower ground ring 62 is provided in such a way that an outer portion thereof is exposed to the exhaust space ES and an inner portion thereof is buried in the lateral surface coating member 16.

Also, the upper ground ring 61 and the lower ground ring 62 may be formed of an annular shape by using one member or may be formed of an annular shape by combining a plurality of member.

A ground rod 66 connected to a ground potential is provided between the upper ground ring 61 and the lower ground ring 62 to be accommodated in a circular hole 65 provided in the lateral surface coating member 16. The ground rod 66 may move up and down freely by a driving mechanism 67 and may be set to two states, that is, a first state where the ground rod 66 contacts the upper ground ring 61 and does not contact the lower ground ring 62 and a second state where the ground rod 66 contacts the lower ground ring 62 and does not contact the upper ground ring 61. As shown in FIG. 1, in the present embodiment, two ground rods 66 are provided around the holding stage 12 to be spaced apart from each other at 180 degrees. However, the number of ground rods 66 may be one or more than three.

When the ground rod 66 contacts the upper ground ring 61 and does not contact the lower ground ring 62, the upper ground ring 61 is electrically grounded and the lower ground ring 62 is in an electrically floating state. Also, when the ground rod 66 contacts the lower ground ring 62 and does not contact the upper ground ring 61, the lower ground ring 62 is electrically grounded and the upper ground ring 61 is in an electrically floating state.

When a direct current voltage is applied from the upper direct current power source 42 to the upper electrode plate 39, the upper ground ring 61 and the lower ground ring 62 serve as ground electrodes of the direct current voltage. In other words, in this case, electrons emitted from the upper electrode plate 39 reach the upper ground ring 61 or the lower ground ring 62 forming a ground potential, and thus a direct current flows in the processing space PS.

Accordingly, when the ground rod 66 is positioned in such a way that the upper ground ring 61 is electrically grounded and the lower ground ring 62 is electrically floated, plasma in the processing space PS may be prevented from leaking into the exhaust space ES below the exhaust plate 19, and thus the plasma in the processing space PS has a high density.

Meanwhile, when the ground rod 66 is positioned in such a way that the upper ground ring 61 is electrically floated and the lower ground ring 62 is electrically grounded, leaking of plasma is promoted into the exhaust space ES below the exhaust plate 19, and thus the plasma in the processing space PS has a low density. As such, a state of the plasma may be more finely controlled by moving the ground rod 66 up and down.

In addition, when a direct current voltage is not applied to the upper electrode plate 39, the upper ground ring 61 and the lower ground ring 62 serve as ground electrodes to plasma.

In the plasma etching apparatus 10 having the above-described structure, high-frequency power is applied to the processing space PS to generate high-density plasma from the processing gas supplied from the shower head 36 in the processing space PS, the generated plasma is maintained in a desired state by the direct current in the processing space PS, and an etching process is performed on the semiconductor wafer W by using the plasma.

Next, a process of plasma-etching a thin film formed on the semiconductor wafer W by using the plasma etching apparatus 10 having the above-described structure will be described. First, the gate valve 46 is opened, and the semiconductor wafer W is carried into the processing chamber 11 via a load lock chamber (not shown) from the inlet/outlet 44 by using, for example, a transfer robot (not shown), and then is placed on the holding stage 12. Then, the transfer robot is carried out of the processing chamber 11, and the gate valve 46 is closed. Then, an inside of the processing chamber 11 is evacuated via the rough pumping exhaust pipe 20 and the main exhaust pipe 21 by using a vacuum pump (not shown).

After the inside of the processing chamber 11 reaches a predetermined vacuum level, a predetermined processing gas (an etching gas) is introduced into the processing chamber 11 via the shower head 36, and thus the inside of the processing chamber 11 is maintained at predetermined pressure. In this state, high-frequency power having frequency of, for example, 40 MHz, is applied from the first high-frequency power source 22 to the holding stage 12. Also, high-frequency power (for biasing) having frequency of, for example, 3.2 MHz, is applied from the second high-frequency power source 24 to the holding stage 12 to drag ions. Here, a predetermined direct current voltage (for example, a direct current voltage of +2,500 V) is applied from the direct current power source 28 for an electrostatic chuck to the electrode plate 26 of the electrostatic chuck 27, and the semiconductor wafer W is adsorbed on the electrostatic chuck 27 by Coulomb force or Johnson-Rahbek force.

As described above, the high-frequency power is applied to the holding stage 12, which is the lower electrode, and thus an electric field is formed between the shower head 36, which is the upper electrode, and the holding stage 12, which is the lower electrode. Due to the electric field, a discharge occurs in the processing space PS in which the semiconductor wafer W is held, and thus a thin film formed on the semiconductor wafer W is etched by plasma of the processing gas generated due to the discharge of the processing space PS.

Also, since a direct current voltage may be applied from the upper direct current power source 42 to the shower head 36 during processing of the plasma, the following effect may be obtained. That is, depending on processes, plasma having a high electron density and low ion energy may be required. If a direct current voltage is used in this case, ion energy injected into the semiconductor wafer W is suppressed, and an electron density of plasma is increased, and thus an etching rate of a film of the semiconductor wafer W to be etched is increased, and a sputtering rate to a film serving as a mask formed on the film of the semiconductor wafer W to be etched is decreased, thereby improving selectivity.

In this instance, electrical states of the upper ground ring 61 and the lower ground ring 62, which serve as ground electrodes with respect to the direct current voltage applied to the shower head 36, may be set to any one of a high-density plasma state or a low-density plasma state by moving the ground rod 66 up and down by using the driving mechanism 67. That is, for example, when a plurality of processes are performed in the processing chamber 11 for batch etching of a multi-layered structure, an etching process under a high-density plasma condition and an etching process under a low-density plasma condition may be performed. In this case, each process may be set to a proper plasma density state by moving the ground rod 66 up and down, thereby performing an etching process as desired.

Then, if the above-described etching process has ended, the high-frequency power is stopped from being applied, the direct current voltage is stopped from being applied, and the processing gas is stopped from being supplied, and thus the semiconductor wafer W is carried out of the processing chamber 11 in the reverse order to that in which the semiconductor wafer W is carried into the processing chamber 11.

As described above, according to the present embodiment, electrical states of the upper ground ring 61 and the lower ground ring 62 may be changed by moving the ground rod 66 up and down, and thus plasma may be more finely controlled compared to a conventional plasma processing apparatus. Also, the present invention is not limited to the above-described embodiment and may be modified in various other ways.

The present invention provides a plasma processing apparatus capable of more finely controlling plasma compared to a conventional plasma processing apparatus.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A plasma processing apparatus comprising:
a processing chamber in which a processing space is provided;
a lower electrode provided in the processing chamber and including a holding stage on which a substrate to be processed is placed;
an exhaust passage being provided between an inner wall of the processing chamber and a lateral surface of the holding stage;
an exhaust plate surrounding the holding stage;
an upper electrode provided in the processing chamber to face the lower electrode;
a high-frequency power source which applies high-frequency power to the lower electrode;
a processing gas supply mechanism which supplies a processing gas for generating plasma to the processing space;
a first ground member formed of a conductive material and having a ring shape, wherein the first ground member is provided surrounding the lower electrode above the exhaust plate in such a way that at least a portion of the first ground member is exposed to the exhaust passage, and the first ground member forms a ground potential;
a second ground member being provided surrounding the lower electrode below the exhaust plate and is formed of a conductive material and has a ring shape, wherein at least a portion of the second ground member is exposed to the exhaust passage, and the second ground member forms a ground potential; and
a ground rod that moves up and down between the first and second ground members and contacts any one and only one of the first or second ground member to adjust a ground state of the first or second ground member.

2. The plasma processing apparatus of claim 1, further comprising a direct current power source that applies a direct current voltage to the upper electrode, wherein the first and second ground members serve as ground electrodes to the direct current voltage applied from the direct current voltage power source.

3. The plasma processing apparatus of claim 2, wherein the first and second ground members are formed of silicon, silicon carbide, or a solid material comprising aluminum.

4. The plasma processing apparatus of claim 1, wherein the first and second ground members are formed of silicon, silicon carbide, or a solid material comprising aluminum.

5. The plasma processing apparatus of claim 1, wherein the first and second ground members are provided to surround the lower electrode.

6. The plasma processing apparatus of claim 1, wherein a plurality of the ground rods are provided.

* * * * *